United States Patent [19]
Jochheim

[11] Patent Number: 6,137,050
[45] Date of Patent: Oct. 24, 2000

[54] METHOD FOR MANUFACTURING A HOUSING PART WITH A SCREENING EFFECT FOR RADIO COMMUNICATION EQUIPMENT

[75] Inventor: Edgar Jochheim, München, Germany

[73] Assignee: Siemens Aktiengesellschaft, Munich, Germany

[21] Appl. No.: 09/101,120

[22] PCT Filed: Oct. 30, 1997

[86] PCT No.: PCT/DE97/02530

§ 371 Date: Jun. 30, 1998

§ 102(e) Date: Jun. 30, 1998

[87] PCT Pub. No.: WO98/19507

PCT Pub. Date: May 7, 1998

[30]     Foreign Application Priority Data

Oct. 31, 1996 [DE] Germany ........................ 296 19 002 U

[51] Int. Cl.[7] .................................................. H05K 9/00
[52] U.S. Cl. .................................. 174/35 R; 174/35 MS; 174/51; 29/527.5; 361/753; 361/816; 361/818
[58] Field of Search ............................. 174/35 R, 35 MS, 174/51; 29/527.5; 361/818, 753, 816

[56]           References Cited

U.S. PATENT DOCUMENTS 5,150,282  9/1992  Tomura et al. .......................... 361/424
5,226,210  7/1993  Koskenmaki et al. ................... 29/527.5
5,243,126  9/1993  Chow et al. .......................... 174/35 MS
5,731,963  3/1998  Heiss et al. .............................. 361/814

FOREIGN PATENT DOCUMENTS 0 465 399    5/1991   European Pat. Off. .
196 30 966   7/1996   Germany .
196 30 967   7/1996   Germany .

*Primary Examiner*—William A. Cuchlinski, Jr.
*Assistant Examiner*—Ronnie Mancho
*Attorney, Agent, or Firm*—Hill & Simpson

[57]             ABSTRACT

A method for manufacturing a housing part with shielding for a radio device having shell-shaped housing parts is provided. The housing parts have open sides facing toward one another for accommodating the working equipment of the radio device. A wire weave is fitted to the inside contour of the housing part and the wire weave and housing part are introduced into an injection mold. Portions of the wire weave corresponding to all contact surfaces are covered with a foil corresponding to the dimensions of the desired contact surfaces. The foils are removed after the injection molding process.

6 Claims, 2 Drawing Sheets

METHOD FOR MANUFACTURING A HOUSING PART WITH A SCREENING EFFECT FOR RADIO COMMUNICATION EQUIPMENT

FIELD OF THE INVENTION

The present invention is directed to a method for manufacturing housing parts with EMI shielding effect for a radio device. The housing parts are shell shaped and having their open sides facing toward one another and lying on one another, said housing parts serving the purpose of accepting the radio device when the radio device is installed in the housing.

BACKGROUND OF THE INVENTION

A shield for protection against noise emission and noise transmission of electromagnetic radiation is required in radio devices, such as mobile radiotelephone or, respectively, cordless telephone sets, for protection of the radiofrequency and low-frequency logic assemblies. Soldered shielding frames, shielding plates, metallized plastic housings, diecast housings, etc., can be employed in a known way for shielding. Such component parts increase the weight of the device, enlarge the device volume, make the device more expensive and are extremely fabrication-intensive due to numerous difficult assembly processes. The employment of metallized or galvanized plastic as housing parts is also complicated in fabrication terms since two completely separate work steps with different machine tools are required.

SUMMARY OF THE INVENTION

The invention is based on the object of manufacturing housing parts for a housing of the aforementioned type in a simple way, said housing parts exhibiting a good shielding effect.

For a housing part of the species initially described, this object is achieved in that a wire weave shaped to correspond to the inside contour of the housing part is introduced into an injection mold for the housing part. All contact surfaces of said wire weave is covered with a foil corresponding to the dimensions of the desired contact surface. The foil is removed after the subsequent injection molding process with an insulating material.

The fabrication-oriented problem of an additional production step is solved given the housing parts manufactured according to the present invention since the housing part can be manufactured in a single operation. Over and above this, the invention enables the omission of additional EMC seals that previously had to be either inserted in the assembly of the housing or, respectively, dispensed in an additional processing step.

DE 19 515 010.4 discloses a housing part wherein a foil is back-injected. However, the disadvantage exists given this known housing part that the foil cannot adapt to the existing, tight radii and the foil can therefore tear.

In an embodiment, the present invention provides a method for manufacturing a housing part with shielding function for a radio device, the housing part comprising a shell with an open side and a closed side comprising an inside surface defining an inside contour, the method comprising the following steps: providing the housing part; fitting a wire weave to the inside contour of the housing part, the wire weave comprising at least one surface intended to serve as an electrical contact surface having a length and a width and at least one other surface intended to be covered with insulating material; introducing the wire weave and housing part into an injection mold for the housing part and covering said at least one surface of the wire weave intended to serve as a contact surface with a foil having a length and a width corresponding to the length and width of the electrical contact surface; injecting an insulating material into the injection mold thereby covering the other surface of the wire weave and the foil with insulating material; and removing the foil and any insulating material disposed thereon.

In an embodiment, the foil is an adhesive foil.

In an embodiment, the at least one surface of the contact weave intended to serve as a contact surface provides a low-impedance contact.

In an embodiment, the wire weave includes a plurality of surfaces intended to serve as contact surfaces and a plurality of foils are therefore employed.

Other objects and advantages of the present invention will become apparent upon reading the following detailed description and appended claims, and upon reference to the accompanying drawings.

BRIEF DESCRIPTION OF THE DRAWINGS

The invention is explained below on the basis of exemplary embodiments shown in the drawings, wherein.

Figure 1:
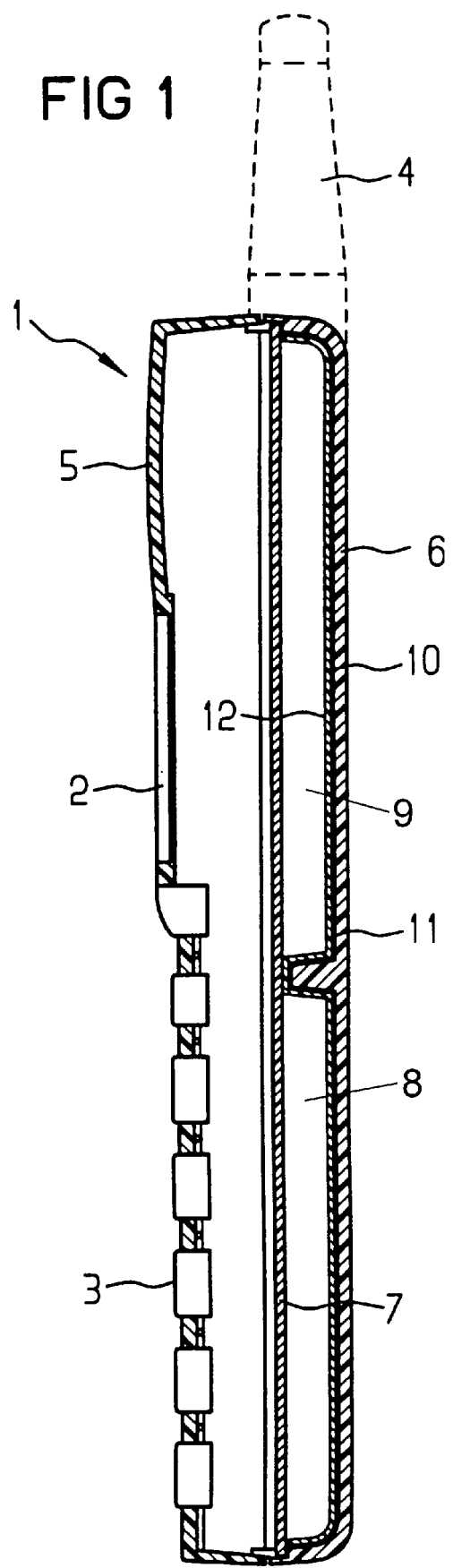
FIG. 1 is a longitudinal sectional view taken through a radio device in which a housing part manufactured in accordance with the present invention.
Figure 2:
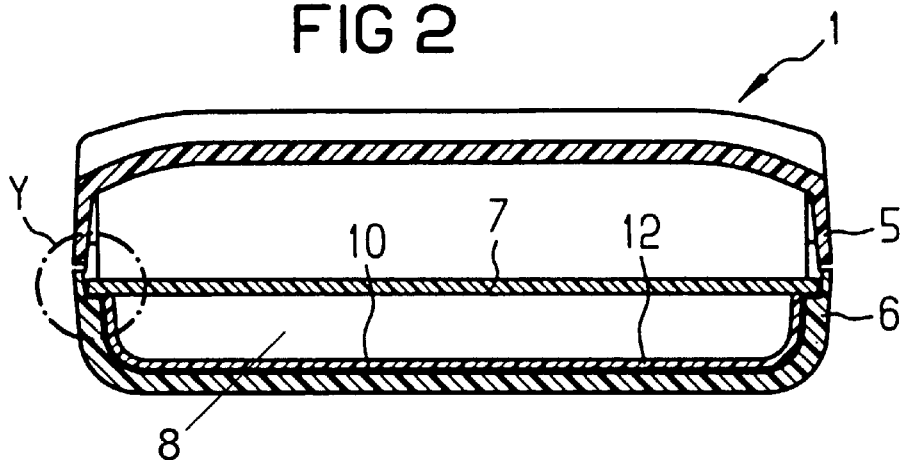
FIG. 2 is a sectional view taken through the radio device of FIG. 1 between the keys of the radio device.

It should be understood that the drawings are not necessarily to scale and that the embodiments are sometimes illustrated by graphic symbols, phantom lines, diagrammatic representations and fragmentary views. In certain instances, details which are not necessary for an understanding of the invention or which render other details difficult to perceive may have been omitted. It should be understood, of course, that the invention is not necessarily limited to the particular embodiments illustrated herein.

DETAILED DESCRIPTION OF THE PRESENTLY PREFERRED EMBODIMENTS

At its upper side, the radio device 1 comprises a display 2 as well as a key field 3. An antenna 4 is laterally attached to the upper end face. The housing of the radio device is composed of an upper shell 5 and of a lower shell 6 that are arranged lying on one another with their open sides facing toward one another. The upper shell 5 includes clearances for the display 2 as well as for the key field 3. A printed circuit board 7 for the acceptance of radiofrequency components and logic assemblies of the radio device is arranged between the half shells 5 and 6 lying on one another. The lower shell 6 must therefore be employed as shielding in order to achieve an EMC shielding. In the illustrated exemplary embodiment, the lower shell 6 comprises two shielded chambers 8 and 9.

Inventively, the lower shell 6 is manufactured by extrusion coating and back-injection of a wire weave 10. A wire weave 10 is fitted to the housing part 6 to be shielded. The wire weave 10 and housing part 6 are then introduced into an injection mold. All surfaces of the wire weave 10 corresponding to contact surfaces to contact partners are covered with a foil corresponding to the dimensions of the desired contact surfaces. The foils are removed after the subsequent injection molding process with an insulating material.

The surfaces uncovered during the injection molding process are back-injected, i.e. the portions of the wire weave 10 that are not covered with foil are extrusion coated. In an embodiment, adhesive foils may be employed.

The exposed surfaces 11 form the electrical contact surfaces, whereas the extrusion-coated surface 12 acts in insulating fashion as inner insulation layer 12 to possible components lying on printed circuit boards in order to prevent short circuits.

As a result of the lattice structure of the contact surfaces 11, i.e. of the wire weave 10, an additional seal can be foregone because of the roughness of the surface 11 provided by the wire weave 10.

Housing part 6, contact surfaces 11 and insulation layer 12 are produced in one manufacturing step.

Figure 3:
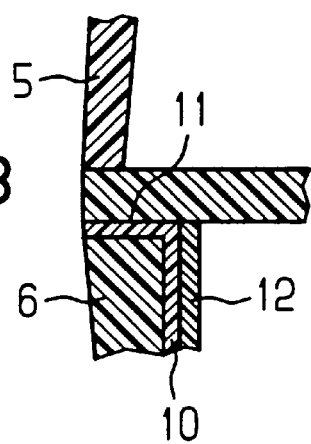
FIG. 3 is a first embodiment showing a detailed view of the section labeled Y in FIG. 2.
Figure 4:
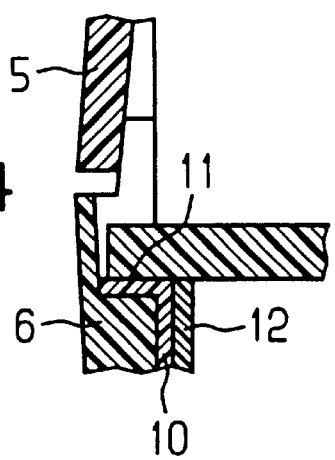
FIG. 4 is a second embodiment showing a detailed view of the section labeled Y in FIG. 2.

FIGS. 3 and 4 show details in the seating region of the printed circuit board on the shell edge in a detailed view. In the embodiment of FIG. 3, the wire weave 10 is thereby continued up to the upper side of the lower shell 6 in order to form a contact to the grounding surfaces of the printed circuit board 7 at this location. In the embodiment of FIG. 4, the inside of the lower shell is stepped in the upper region, whereby the printed circuit board 7 has its underside lying on the wire weave 10 on that surface of the step parallel to the printed circuit board 7, this producing a low-impedance contact to the grounding surfaces of the printed circuit board 7 at the connection to the printed circuit board 7.

From the above description it is apparent that the objects of the present invention have been achieved. While only certain embodiments have been set forth, alternative embodiments and various modifications will be apparent from the above description to those skilled in the art. These and other alternatives are considered equivalents and within the spirit and scope of the present invention.

What is claimed is:

1. A method for manufacturing a housing part with shielding function for a radio device, the housing part comprising a shell with an open side and a closed side comprising an inside surface defining an inside contour, the method comprising the following steps:

providing the housing part;

fitting a wire weave to the inside contour of the housing part, the wire weave comprising at least one surface intended to serve as an electrical contact surface having a length and a width and at least one other surface intended to be covered with insulating material;

introducing the wire weave and housing part into an injection mold for the housing part and covering said at least one surface of the wire weave intended to serve as a contact surface with a foil having a length and a width corresponding to the length and width of the electrical contact surface;

injecting an insulating material into the injection mold thereby covering the other surface of the wire weave and the foil with insulating material; and removing the foil and any insulating material disposed thereon.

2. The method of claim 1 wherein the foil is an adhesive foil.

3. The method of claim 1 wherein the at least one surface of the contact weave intended to serve as a contact surface provides a low-impedance contact.

4. A method for manufacturing a housing part with shielding function for a radio device, the housing part comprising a shell with an open side and a closed side comprising an inside surface defining an inside contour, the method comprising the following steps:

providing the housing part;

fitting a wire weave to the inside contour of the housing part, the wire weave comprising a plurality of surfaces intended to serve as electrical contact surfaces each having a length and a width, the wire weave also comprising a plurality of other surfaces intended to be covered with insulating material;

introducing the wire weave and housing part into an injection mold for the housing part and covering each of said plurality of surfaces of the wire weave intended to serve as contact surfaces with a foil having a length and a width corresponding to the length and width of the corresponding electrical contact surface;

injecting an insulating material into the injection mold thereby covering the other surfaces of the wire weave and the foils with insulating material; and removing the foils and any insulating material disposed thereon.

5. The method of claim 4 wherein the foils are adhesive foils.

6. The method of claim 4 wherein the surfaces of the contact weave intended to serve as a contact surfaces provide low-impedance contacts.

* * * * *